[72] Inventor James E. Kauppila
Troy, Mich.
[21] Appl. No. 778,625
[22] Filed Nov. 25, 1968
[45] Patented Dec. 21, 1971
[73] Assignee General Motors Corporation
Detroit, Mich.

[54] PASSIVATED WIRE-BONDED SEMICONDUCTOR DEVICE
7 Claims, 5 Drawing Figs.

[52] U.S. Cl. .......... 317/235 R, 317/235 B, 317/234 L, 317/234 M, 29/571, 29/581
[51] Int. Cl. .......... H01l 1/14, H01l 11/14
[50] Field of Search .......... 29/571, 589; 317/234 (5.3), 234 (5.4), 235 (21.1), 235 (46), 235 (22), 235 (22.2)

[56] References Cited
UNITED STATES PATENTS

| | | | |
|---|---|---|---|
| 3,419,765 | 12/1968 | Clark et al. | 317/234 |
| 3,044,147 | 7/1962 | Armstrong | 29/25.3 |
| 3,296,508 | 1/1967 | Hofstein | 317/235 |
| 3,258,663 | 6/1966 | Weimer | 317/235 |

FOREIGN PATENTS

| | | | |
|---|---|---|---|
| 6,706,403 | 11/1967 | Netherlands | 317/235 |
| 1,172,280 | 11/1969 | Great Britain | 317/235 |

*Primary Examiner*—John W. Huckert
*Assistant Examiner*—Martin H. Edlow
*Attorneys*—William S. Pettigrew and R. J. Wallace

ABSTRACT: A semiconductive device is described in which electrical contact is made with the semiconductor surface through a rupture in an overlying frangible dielectric coating. Contact is achieved by forming an electrode pad on the semiconductor surface, coating the surface of the semiconductor and the electrode pad with a frangible layer of dielectric, forming a terminal connector contact pad on the dielectric coating over the electrode pad, rupturing the dielectric layer to communicate the pads, and bonding a terminal lead to the connector contact pad. In a preferred embodiment, the rupturing and bonding steps are simultaneously achieved by compression bonding a terminal wire to the connector contact pad.

INVENTOR.
James E. Kauppila
BY
R. J. Wallace
ATTORNEY

PASSIVATED WIRE-BONDED SEMICONDUCTOR DEVICE

BACKGROUND OF THE INVENTION

Dielectric coatings are used on the surface of many semiconductor devices. Dielectric coatings are used as an active element in metal-insulator-semiconductor field effect devices, and as a passivating coating in junction semiconductor devices such as transistors, rectifiers and the like. Silicon dioxide and silicon nitride are conventionally used in these applications because they are readily configured to precise surface geometrics by photolithographic masking and etching processing techniques. Many other, more desirable dielectrics are so chemically inert that they are not amenable to such processing. Hence, the use of these other dielectrics is limited.

It would be highly desirable, for example, to use a dielectric such as tantalum oxide in producing an insulated-gate field effect transistor. However, tantalum oxide is so resistant to chemical attack by etchants that conventional, economical techniques cannot be used to make devices with such a dielectric. Moreover, the more costly unconventional techniques may not even be adequate to produce the precise surface geometrics required in miniature devices for monolithic microcircuits.

Also, it appears that other dielectrics may be more effective in passivating the surface of junction semiconductor devices than silicon dioxide and silicon nitride. However, the practical and processing problems incident to their use normally offset the inherent benefits that might be realized.

If one could at least reliably and economically precisely make very small apertures in these other dielectrics, their commercial use could be considerably enlarged. Such apertures are necessary to make contact with the underlying semiconductor surface. I have found an even better technique, a technique in which no such aperture at all need be specially produced.

In my technique, the dielectric is sandwiched between two ductile metal pads and ruptured in the interfacial area to provide electrical communication through the dielectric coating. This technique is not only useful for making contacts through dielectrics such as tantalum oxide but also useful in making contacts through the more conventional dielectrics such as silicon dioxide and silicon nitride. Hence, my technique eliminates the need for photolithographic masking and etching. In addition, it provides greater flexibility in processing because it permits complete interchangeability of dielectrics. In either making insulated-gate field effect devices or passivating junction devices, the dielectric with the most desirable properties can be selected and used. Moreover, that dielectric can be replaced by any other dielectric, without changing anything else in the processing.

SUMMARY OF THE INVENTION

It is, therefore, an object of this invention to provide an improved method for making a semiconductive device electrical connection through a passivating coating on the surface of a semiconductive body. It is a further object of the invention to provide a technique for contacting a semiconductive surface directly through an insulating coating. A still further object of the invention is to provide semiconductive devices having continuous dielectric coatings thereon in which contact to the semiconductor surface is made through a rupture in the dielectric coating.

These and other objects of the invention are attained by forming an electrode pad on a selected surface area of a semiconductive element, coating the surface of the semiconductive element and the electrode pad with a layer of a brittle dielectric, forming a terminal connector contact pad on the dielectric coating over the electrode pad, compressing a central portion of the connector contact pad to rupture the brittle dielectric layer and connect the connector contact pad and electrode pad together, and bonding a connector to the connector contact pad. If the contact pads and dielectric coating are of a selected thickness relationship, the dielectric la. can be ruptured and the two contact pads connected, by simply compression-bonding a terminal wire to the connector pad.

BRIEF DESCRIPTION OF THE DRAWING

Other objects, features and advantages of the invention will become more apparent from the following description of preferred examples thereof and from the drawing, in which.

DESCRIPTION OF THE PREFERRED EMBODIMENTS

Figure 1:
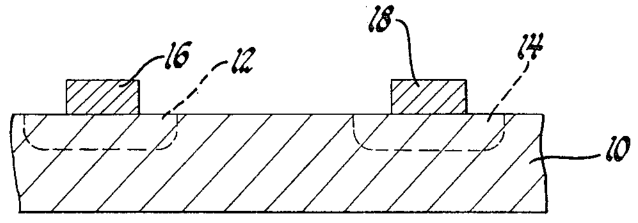
FIGS. 1–4 show fragmentary sectional views illustrating four successive stages in making an insulated-gate field effect transistor in accordance with the invention.

This invention is particularly useful in making an insulated-gate field effect transistor. FIG. 1 shows a semiconductive element 10, having source region 12 and drain region 14 with respective overlying low-resistance electrode pads 16 and 18, all produced by conventional oxide masking and photolithographic techniques. The source and drain electrode pads 16 and 18 are of evaporated aluminum, about 0.5 micron thick, and are in ohmic contact with their respective source and drain regions 12 and 14.

Figure 2:
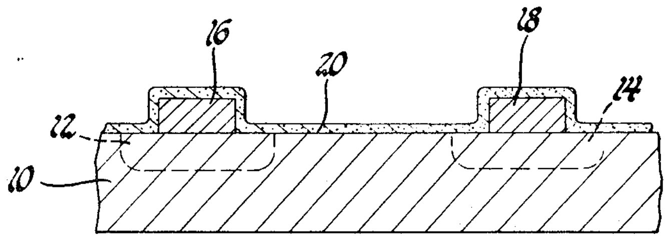

As shown in FIG. 2 a continuous 0.1 micron thick film 20 of tantalum oxide ($Ta_2O_5$) is reactively sputtered onto the entire surface of the semiconductive element 10, including electrode pads 16 and 18.

Figure 3:
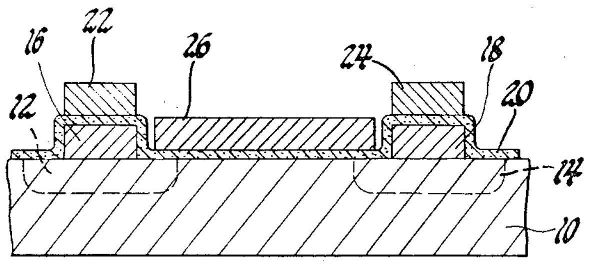

Referring now to FIG. 3, terminal connector contact pads 22 and 24 are evaporated onto the surface of dielectric film 20 over the source and drain electrode pads 16 and 18, respectively. The contact pads 22 and 24 are of the same configuration as and in register with their corresponding electrode pads and of about 0.5 micron in thickness. An aluminum gate electrode-connector pad of similar thickness is simultaneously evaporated onto film 20 between the source and drain contact pads 22 and 24.

Figure 4:
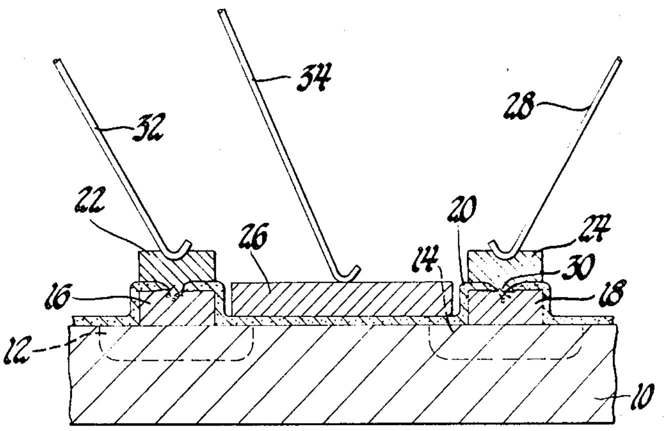
Figure 5:
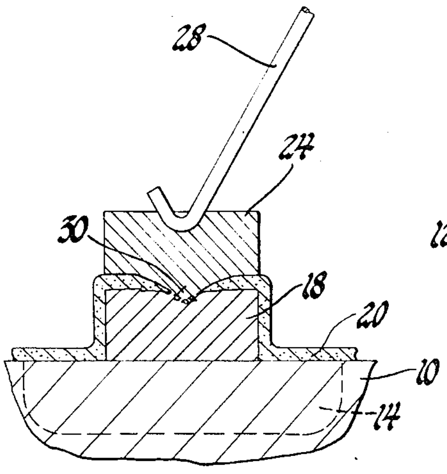
FIG. 5 shows an enlarged fragmentary sectional view of the drain electrode area of the insulated-gate field effect transistor shown in FIG. 4.

FIG. 4 shows the device after thermocompression bonding of 1 mil diameter gold terminal lead wires 28, 32, and 34 to their respective contact pads. In the thermocompression bonding area the cross-sectional area of a 1-mil length of the gold wire is reduced about 20–70 percent. In bonding gold wire 28 by this technique to drain contact pad 24, the subjacent portion of the dielectric film 20 sandwiched between contact pad 24 and electrode 18 ruptures at 30. Upon rupture, the metal of the two contact pads are pressed into contact with one another and bond together, providing a low-resistance connection between terminal wire 28 and drain region 14. A 1-mil gold wire 32 is similarly thermocompression bonded to source connector pad 22 and thereby electrically connected to source region 12. A 1-mil gold wire 34 is also similarly bonded to the insulated-gate electrode-connector pad 26. However, gate electrode-connector pad 26 does not have a readily deformable electrode pad underneath it. Consequently, when wire 34 is bonded to it, film 20 does not rupture and remains continuous and insulating.

Film 20 can be made of any brittle dielectric which has dielectric properties electrically suitable for the particular device which is being made. Dielectrics such as tantalum oxide, silicon dioxide and silicon nitride can be used as well as any other brittle dielectric, particularly those having a Moh hardness of about 7 or greater.

The electrode and the terminal connector contact pads are preferably of a ductile metal such as gold, platinum, and aluminum to permit the deformations necessary to rupture the dielectric film. The particular metal used should be softer than the dielectric and preferably of a Moh hardness of no more than about one-half that of the dielectric. It is preferred that both the electrode and contact pads be made of the same metal, or at least of metallurgically compatible metals. In such instance, the thermocompression bonding of the connector wire to the contact pads cannot only produce a mechanical but also a chemical bonding between the two pads, insuring acquisition of a low-resistance connection.

The electrode pads 16 and 18 on the semiconductor surface must of sufficient thickness to provide adequate deformation to rupture the dielectric film and allow intimate association with the metal of the overlying contact pad. This minimum thickness is principally dependent on the thickness of the dielectric film. It should be at least as thick as the dielectric coating and preferably twice as thick. For dielectric coatings of approximately 0.1 micron, I would use at least 0.2 micron electrode pad thicknesses. However, to ensure that a sufficient thickness is achieved, I prefer to use electrode pad thicknesses of about 0.5 micron. Little advantage is ordinarily gained in using higher relative thicknesses.

As indicated in the preceding paragraph, the dielectric film thickness primarily determines the minimum thickness of the underlying electrode pad. For insulated-gate field effect transistors I prefer to use a dielectric thickness of about 0.05–0.15 micron. However, if the dielectric coating is to be used in passivating the surface of a junction semiconductor device, the dielectric coating should be of the order of 1 micron. In such instance the underlying contact pad should be at least about 2 microns, but not significantly greater. Little advantage is realized in using dielectric thicknesses of the order of 10 microns.

The minimum thickness of the terminal connector contact pad on top of the dielectric film is principally determined by the amount of metal necessary to achieve an adequate terminal connection. For thermocompression bonding, for example, a thickness of at least 0.1 micron is necessary and preferably 0.2–0.5 micron. Thicknesses in excess of this tend to unduly increase the rupturing pressure required and for that reason are not preferred. The area of pressure should be well within the area of pad registration and only of limited dimension to ensure rupture at a low pressure, well within the area of pad registration.

It is to be appreciated that the maximum benefit of this invention is to be obtained where the terminal connector wire and the fracture of the dielectric coating under the contact pad is simultaneously achieved. However, it is recognized that should one choose to do so these two steps can be successively performed. The fracture and the bonding can be readily simultaneously achieved with gold or aluminum wires of up to 3-mil diameter by compression bonding techniques, such as cold welding, ultrasonic bonding and thermocompression bonding. However, I prefer to use thermocompression bonding.

It is to be understood that although this invention has been described in connection with certain specific examples thereof, no limitation is intended thereby except as defined in the appended claims.

I claim:

1. A semiconductive device comprising a semiconductive body having a PN-junction thereon terminating at a surface of said body, a first layer of ductile metal on a selected localized region of said surface adjacent said junction, a coating of a brittle dielectric material on said surface over said metal layer and said junction, said dielectric coating being at least 0.05 micron thick and less than about one-half as thick as said first metal layer, a second layer of ductile metal on said dielectric coating substantially registered over said first layer of metal, a terminal connector wire compression bonded to said second metal layer, and said metal layers directly contacting one another through a fracture in said dielectric coating under the compression-bonded wire to provide a low-resistance electrical connection between said surface and said wire.

2. The semiconductive device defined in claim 1 wherein said dielectric coating is no greater than about 1 micron in thickness and said first and second metal layers are less than about 10 microns in thickness.

3. The insulated-gate field effect transistor defined in claim 1 wherein the dielectric coating is about 0.05–0.2 micron in thickness and the ductile metal layers are about 0.2–0.5 micron in thickness, and the connector wires are less than about 3 mils in diameter.

4. The insulated-gate field effect transistor defined in claim 3 wherein the dielectric coating is of tantalum oxide, the metal layers are of aluminum and the connector wires are of a metal selected from the group consisting of aluminum and gold.

5. The insulated-gate field effect transistor as defined in claim 3 wherein the dielectric coating is an insulating, relatively inert, brittle material having a Moh hardness of at least 7.

6. In an insulated-gate field effect transistor having spaced-apart source and drain regions, a gate region therebetween, the improvement which comprises each of said source and drain regions having a first layer of ductile metal thereon, a layer of dielectric material at least 0.05 micron thick and less than about one-half as thick as said first metal layer, a second metal layer on said dielectric layer, a connector wire portion compression bonded to said second metal layer and said first and second metal layers at least touching one another through a fracture in said dielectric coating under the bonded portion of said connector wire to provide a low-resistance electrical connection between said connector wire and said region.

7. An insulated-gate field effect transistor comprising a semiconductive body having a surface, source and drain regions on said surface, a first layer of ductile metal on each of said source and drain regions, a coating of a dielectric material on said body covering said surface and the metal layer on each of said regions, said dielectric coating being less than one-half as thick as said metal layer, a second layer of ductile metal on said dielectric coating over each of said source and drain regions and over a gate region therebetween, a separate connector wire compression bonded to the second metal layer over each of said source, drain and gate regions, said first and second metal layers touching one another through a fracture in said dielectric coating over each of said source and drain regions to provide a low-resistance electrical connection between each region and its connector wire, and said dielectric coating being otherwise continuous between said source and drain regions.

* * * * *

PO-1050
(5/69)

UNITED STATES PATENT OFFICE
CERTIFICATE OF CORRECTION

Patent No. 3,629,669 Dated December 21, 1971

Inventor(s) James E. Kauppila

It is certified that error appears in the above-identified patent and that said Letters Patent are hereby corrected as shown below:

Claim 3, column 4, bridging lines 16 and 17, "claim 1" should read -- claim 7 --.

Signed and sealed this 2nd day of May 1972.

(SEAL)
Attest:

EDWARD M.FLETCHER, JR.
Attesting Officer

ROBERT GOTTSCHALK
Commissioner of Patents